United States Patent
Troemel, Jr. et al.

(10) Patent No.: US 7,948,726 B2
(45) Date of Patent: May 24, 2011

(54) ELECTROSTATIC DISCHARGE (ESD) PROTECTION CIRCUIT AND METHOD

(75) Inventors: Hans A. Troemel, Jr., Sharpsburg, GA (US); Brian R. McClure, Newnan, GA (US)

(73) Assignee: Panasonic Automotive Systems Company of America, division of Panasonic Corporation of North America, Peachtree City, GA (US)

(*) Notice: Subject to any disclaimer, the term of this patent is extended or adjusted under 35 U.S.C. 154(b) by 152 days.

(21) Appl. No.: 12/284,883

(22) Filed: Sep. 25, 2008

(65) Prior Publication Data

US 2010/0073834 A1    Mar. 25, 2010

(51) Int. Cl.
*H02H 9/00* (2006.01)
*H01C 7/12* (2006.01)
*H02H 1/00* (2006.01)
*H02H 1/04* (2006.01)
*H02H 3/22* (2006.01)

(52) U.S. Cl. .................... 361/56; 361/118
(58) Field of Classification Search .......... 361/56
See application file for complete search history.

(56) References Cited

U.S. PATENT DOCUMENTS

| | | | |
|---|---|---|---|
| 3,551,855 A | 12/1970 | Seidel | |
| 4,683,514 A * | 7/1987 | Cook | 361/111 |
| 5,122,921 A * | 6/1992 | Koss | 361/111 |
| 5,357,397 A | 10/1994 | Leary | |
| 6,002,569 A * | 12/1999 | Horvath | 361/111 |
| 6,355,958 B1 * | 3/2002 | Orchard-Webb | 257/355 |
| 7,170,728 B2 * | 1/2007 | Mueller | 361/56 |
| 7,430,103 B2 * | 9/2008 | Kato | 361/212 |
| 2004/0027779 A1 | 2/2004 | Byrne et al. | |
| 2004/0264095 A1 | 12/2004 | Block et al. | |
| 2005/0063129 A1 * | 3/2005 | Kato | 361/212 |
| 2005/0237684 A1 | 10/2005 | Block et al. | |
| 2008/0049949 A1 | 2/2008 | Snider et al. | |
| 2008/0174925 A1 | 7/2008 | Woo et al. | |
| 2009/0021295 A1 * | 1/2009 | Fu et al. | 327/551 |

* cited by examiner

*Primary Examiner* — Dharti H Patel
(74) *Attorney, Agent, or Firm* — Laurence S. Roach

(57) ABSTRACT

There is disclosed an electrostatic discharge (ESD) protection device and method. An electronic device (100) that employs an exemplary embodiment of the present invention comprises an electronic component (106) having a signal input conductor (302). An exemplary ESD protection circuit (200) includes a spark gap (204) in series with a high pass quarter wave transformer (208). The exemplary ESD protection circuit (200) is adapted to discharge an ESD pulse from the signal input conductor (302) of the electronic component (106) to a ground plane (304) via the spark gap (204) and/or the high pass quarter wave transformer (208).

15 Claims, 3 Drawing Sheets

ELECTROSTATIC DISCHARGE (ESD) PROTECTION CIRCUIT AND METHOD

FIELD OF THE INVENTION

The present invention generally relates to a system and method for protecting electronic devices. In particular, exemplary embodiments of the present invention relate to an electrostatic discharge (ESD) protection circuit that protects an electronic component from an ESD pulse by providing a path for the ESD pulse to follow to a ground plane before the ESD pulse damages the electronic component.

BACKGROUND OF THE INVENTION

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Some microwave radio frequency (RF) devices have very low tolerances to ESD shocks. In fact, an ESD pulse having a magnitude of no more than 100 or 200 volts can damage sensitive components of some RF devices. This is unfortunate, because some RF applications require resistance to much greater ESD discharges, even up to and above 15 kV. In addition, many RF devices are very sensitive to shunt capacitance because of their operating frequencies. This sensitivity to shunt capacitance presents an added requirement for an ESD protection circuit to have very low capacitance, perhaps less than one picofarad.

A typical system approach is to guide ESD energy away from a signal path to a return (ground) path as quickly as possible, in order to shield any ESD-sensitive component connected to the signal path from the ESD signal. In particular, one known approach is to employ shunt devices to ground. These shunt devices may include inductors, polymer devices, and spark gap devices. The shunt inductor approach can be utilized as an RF choke, where the RF impedance is large enough to not to influence the RF performance.

The fundamental transient equation for an inductor is set forth below:

$$V(t) = L * \frac{dI(t)}{dt} \quad \text{Equation 1}$$

where V(t) is the voltage across an inductor at time t and where L is the inductance of the inductor. According to this equation, an inductor is capable of responding to an instantaneous voltage change, but is not capable of responding to an instantaneous current change. Because an inductor does not have a trigger voltage (as do polymer and spark gap ESD devices), the inductor begins to return energy to ground immediately, subject to the maximum current of its windings. For this reason, low capacitance polymer and spark gap ESD devices are typically placed in parallel with an inductor to assist in increasing the current capacity of the overall ESD protection circuit. Such typical ESD protection circuits, however, may not provide robust enough protection for RF components in hostile ESD environments.

SUMMARY OF THE INVENTION

There is provided an electronic device having an ESD protection circuit. An exemplary electronic device comprises an electronic component having a signal input conductor. An exemplary ESD protection circuit includes a spark gap in series with a high pass quarter wave transformer. The exemplary ESD protection circuit is adapted to discharge an ESD pulse from the signal input conductor of the electronic component to a ground plane via the spark gap and/or the high pass quarter wave transformer.

BRIEF DESCRIPTION OF THE DRAWINGS

The above-mentioned and other features and advantages of the present invention, and the manner of attaining them, will become apparent and be better understood by reference to the following description of one embodiment of the invention in conjunction with the accompanying drawings, wherein:

FIG. 4 is a schematic circuit diagram of a high pass quarter wave transformer that is useful in constructing an ESD protection circuit in accordance with an exemplary embodiment of the present invention; and.

Corresponding reference characters indicate corresponding parts throughout the several views. The exemplifications set out herein illustrate a preferred embodiment of the invention, in one form, and such exemplifications are not to be construed as limiting in any manner the scope of the invention.

DETAILED DESCRIPTION OF THE PREFERRED EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
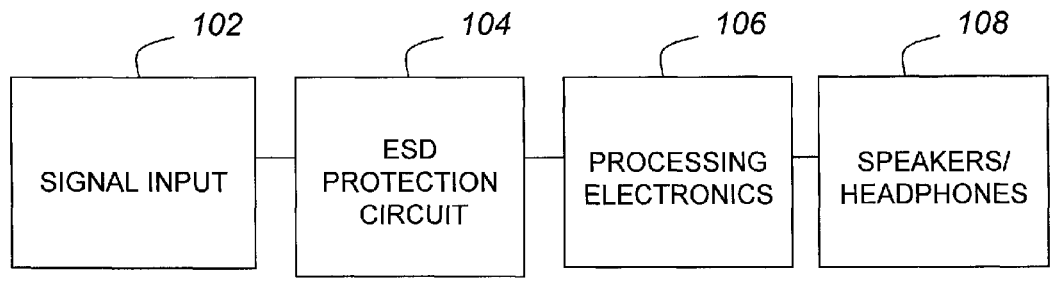
FIG. 1 is a block diagram of an electronic device in accordance with an exemplary embodiment of the present invention.

FIG. 1 is a block diagram of an electronic device in accordance with an exemplary embodiment of the present invention. The electronic device is generally referred to by the reference number 100. The exemplary electronic device 100 illustrated in FIG. 1 is an RF reception device (such as an automotive radio, for example) for receiving and playing RF audio signals or the like. Those of ordinary skill in the art will appreciate that the electronic device 100 may in other exemplary embodiments comprise other types of devices such as computer systems or components, televisions, television set top boxes, DVD players, personal audio players, cameras or the like, to name just a few examples. Moreover, those of ordinary skill in the art will appreciate that exemplary embodiments of the present invention may be useful for protecting any sort of electronic device that is subject to damage by discharging ESD pulses. In addition, those of ordinary skill in the art will appreciate that the various functional blocks shown in FIG. 1 may comprise hardware elements (including circuitry), software elements (including computer code stored on a machine-readable medium) or a combination of both hardware and software elements.

The exemplary electronic device 100 illustrated in FIG. 1 comprises a signal input 102. The signal input 102 may comprise an input from an RF antenna or other signal source. As fully set forth below, an ESD protection circuit 104 is adapted to protect an electronic component such as a processing electronics block 106 from a discharge of an ESD pulse. The electronic component 106 may comprise an RF processing circuit that is adapted to receive an input signal from the signal input 102. The electronic device 100 further comprises one or more speakers 108 (which may comprise headphones) for delivering an audio output signal to a user.

Figure 2:
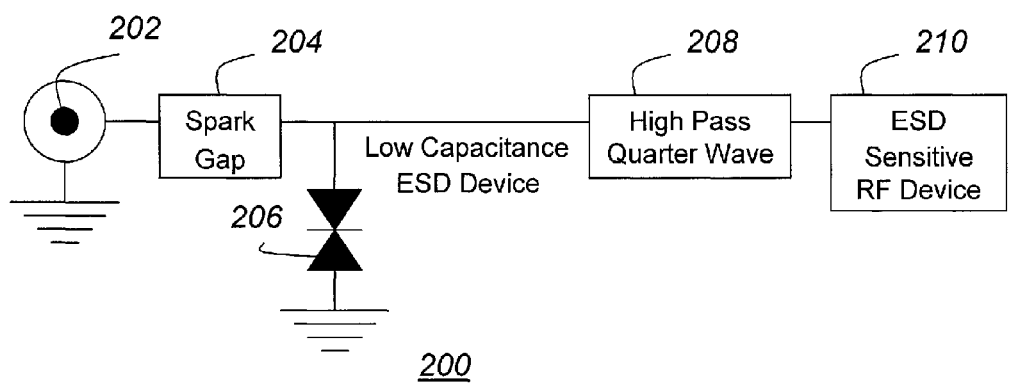
FIG. 2 is a schematic circuit diagram of an ESD protection circuit in accordance with an exemplary embodiment of the present invention.

FIG. 2 is a schematic circuit diagram of an ESD protection circuit in accordance with an exemplary embodiment of the present invention. The ESD protection circuit is generally referred to by the reference number 200. A signal input 202 is adapted to receive an input signal corresponding to, for example, an RF audio program or the like.

As set forth in detail below, the ESD protection circuit 200 employs a spark gap 204 in series with a high pass quarter wave transformer 208 to provide ESD protection to an ESD-sensitive RF device 210. An exemplary embodiment of the present invention may additionally comprise a low capacitance ESD element 206 in parallel with the spark gap 204 and the high pass quarter wave transformer 208 to provide additional ESD protection to the ESD-sensitive RF device 210.

Figure 3:
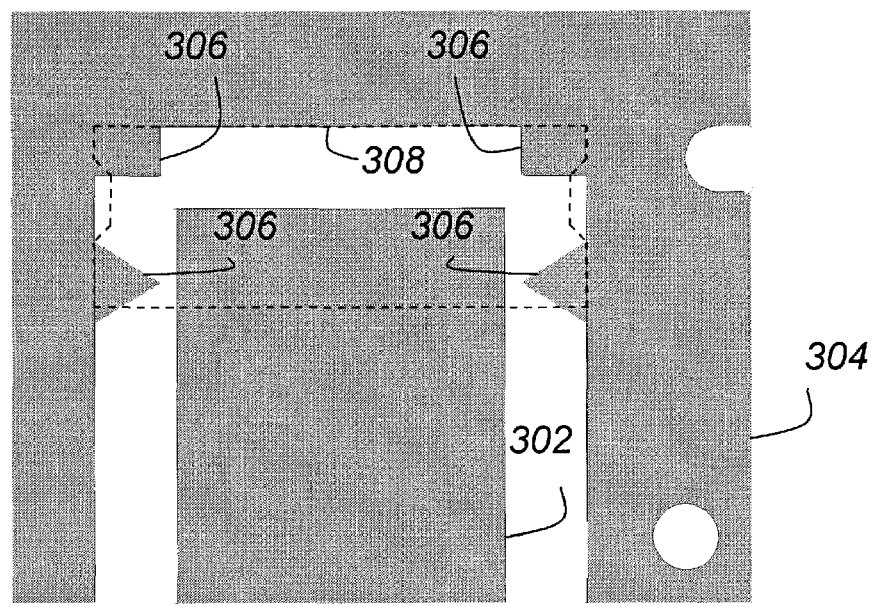
FIG. 3 is a top view of a spark gap circuit that is useful in constructing an ESD protection circuit in accordance with an exemplary embodiment of the present invention.

FIG. 3 is a top view of a spark gap circuit that is useful in constructing an ESD protection circuit in accordance with an exemplary embodiment of the present invention. The spark gap circuit is generally referred to by the reference number 300. Those of ordinary skill in the art will appreciate that the spark gap circuit 300 shown in FIG. 3 represents a layout of a portion of an RF connector disposed on a printed circuit board component of an electronic device.

The spark gap circuit 300 includes a signal input conductor 302 that is adapted to carry a signal such as an RF audio input signal or the like. In FIG. 3, the signal input conductor 302 is implemented as a connector pad of a printed circuit board. In an exemplary embodiment of the present invention, the signal input conductor 302 may be adapted to carry an input signal received via the signal input 202 (FIG. 2). The spark gap circuit 300 includes a ground plane 304. In an exemplary embodiment of the present invention, the spark gap circuit 300 is adapted to provide an electrical path between the signal input conductor 302 and the ground plane 304 when an ESD pulse exceeding a threshold voltage strikes the signal input conductor 302.

The spark gap circuit 300 comprises one or more spark gap pads 306. In the exemplary embodiment of the spark gap circuit 300 shown in FIG. 3, the spark gap pads 306 are generally triangular in shape and are formed as an integral part of the ground plane 304. Because the spark gap pads 306 are formed as an integral part of the ground plane 304, the shunt capacitance of the spark gap pads 306 is very minimal and transparent to operating frequencies up to about 4 GHz. In addition, a vertex of each of the generally triangular spark gap pads 306 is oriented to point in the general direction of the signal input conductor 302. It may be desirable to provide a backup set of spark gap pads to extend the life of the spark gap circuit 300 relative to the use of a single set of spark gap pads.

Those of ordinary skill in the art will appreciate that desirable results may be obtained by positioning the spark gap pads 306 at a substantially high point of current density with respect to the signal input conductor 302. This location may vary depending on individual system design considerations. Those of ordinary skill in the art will appreciate that a wide variety of criteria may be employed to design the exact size and shape of the spark gap pads 306. An example of such a design criteria is to assume an air discharge value of 30 volts per millimeter of separation between the signal input conductor 302 and the ground plane 304. In one exemplary embodiment, the signal input conductor 302 is positioned about 4 mm from the ground plane 304. In such an embodiment, the spark gap circuit 300 would have an activation voltage of about 120 volts. In other words, an ESD pulse exceeding a threshold voltage of about 120 volts would be discharged to the ground plane 304 via the spark gap pads 306.

Those of ordinary skill in the art will appreciate that the general area on a printed circuit board between the signal input conductor 302 and the spark gap pads 306 is desirably free of solder mask. In the exemplary embodiment illustrated in FIG. 3, the area enclosed by a solder mask negative line 308 (shown as a dashed line) is free from solder mask.

Figure 4:
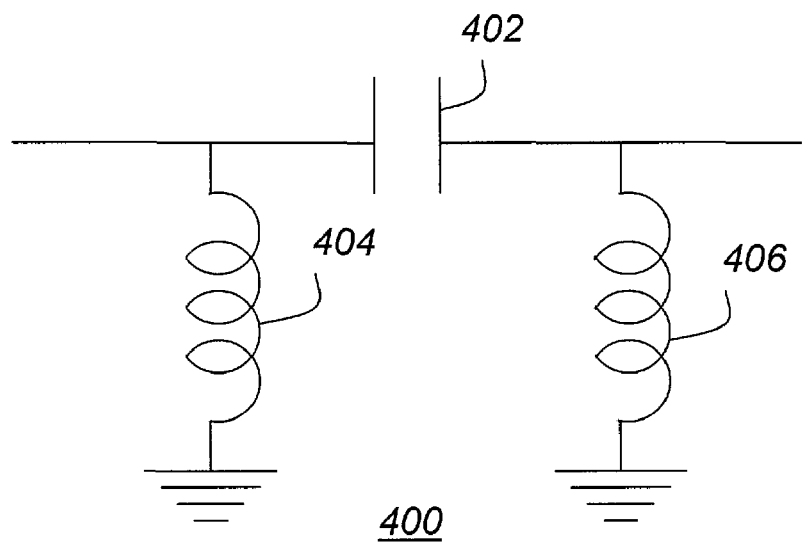

FIG. 4 is a schematic circuit diagram of a high pass quarter wave transformer that is useful in constructing an ESD protection circuit in accordance with an exemplary embodiment of the present invention. The exemplary high pass quarter wave transformer shown in FIG. 4 is generally referred to by the reference number 400. As set forth above, an ESD protection circuit in accordance with an exemplary embodiment of the present invention comprises a spark gap circuit such as the spark gap circuit 300 (FIG. 3) in series with a high pass quarter wave transformer such as the high pass quarter wave transformer 400.

The exemplary high pass quarter wave transformer 400 comprises a capacitive element 402 connect as shown in FIG. 4 in parallel with a first inductive element 404 (connected to a first terminal of the capacitive element 402) and in parallel with a second inductive element 406 (connected to a second terminal of the capacitive element 402). Those of ordinary skill in the art will appreciate that the following equations may be useful in choosing values for the capacitive element 402, the first inductive element 404 and the second inductive element 406:

$$L = \frac{Zo}{2\pi Fo} \quad \text{Equation 2}$$

where L is the inductance of the first inductive element 404 and the second inductive element 406, Zo is the characteristic impedance of the high pass quarter wave transformer 400, and Fo is center frequency; and $$C = \frac{1}{2\pi FoZo} \quad \text{Equation 3}$$

where C is the capacitance of the capacitive element 402, Fo is center frequency, and Zo is the characteristic impedance of the high pass quarter wave transformer 400. Those of ordinary skill in the art will further appreciate that the characteristic impedance of the capacitive element 402, the first inductive element 404 and the second inductive element 406 may be calculated using the following formula:

$$Z_o = \sqrt{Z_s^2 * Z_l^2}$$

Equation 4 where Zs is the source impedance and Zl is the load impedance.

The properties of the high pass quarter wave transformer 400 make it useful in mitigating an ESD strike. For example, the first inductive element 404 and the second inductive element 406 each serve as shunt inductive elements that have lower impedance to allow the high pass quarter wave transformer 400 to transfer more ESD energy to the ground plane 304 (FIG. 3). In addition, the capacitive element 402 in an exemplary embodiment of the present invention has a small value to provide a high impedance series path to the ESD sensitive RF device 210 (FIG. 2 that is being protected. The high impedance of the capacitive element 402 forces more ESD energy to be shunted to the ground plane 304 (FIG. 3) via the first inductive element 404 and the second inductive element 406.

In an exemplary embodiment of the present invention, the high pass quarter wave transformer 400 is a single stage transformer having a relatively narrow bandwidth so that most of the energy received by the high pass quarter wave transformer 400 is reflected back to the source. Those of ordinary skill in the art will appreciate that a high pass quarter wave transformer structure in accordance with an exemplary embodiment of the present invention desirably employs a minus 90 degree phase that occurs at the output of the transformer. In this manner, the ESD energy from an ESD pulse is largely remove from the signal input conductor 302 (FIG. 3) and is returned through the ground plane 304 (FIG. 3).

The use of a high pass quarter wave transformer in an ESD protection circuit in accordance with an exemplary embodiment of the present invention provides matching from a real source impedance to a real load impedance. In addition, quarter wave transformers are used for lossless RF isolation from the source and load impedances because the maximum power transfer only occurs at odd multiples of a quarter wave. In an exemplary embodiment of the present invention, isolation is provided between the ESD protection circuit 200 (FIG. 2) and the ESD sensitive RF device 210 (FIG. 2) being protected. Moreover, the high pass quarter wave transformer 208 provides isolation from broadband energy without sacrificing voltage standing wave ratio (VSWR). The isolation from broadband energy provided by the high pass quarter wave transformer 208 is in part related to the properties of a Fourier transform of an ESD pulse. Those of ordinary skill in the art will appreciate that the signal waveform of an ESD pulse is similar to an exponential decay. Those of ordinary skill in the art will further appreciate that the Fourier transform of an exponential decay is similar to a very broadband energy across the spectrum.

Figure 5:
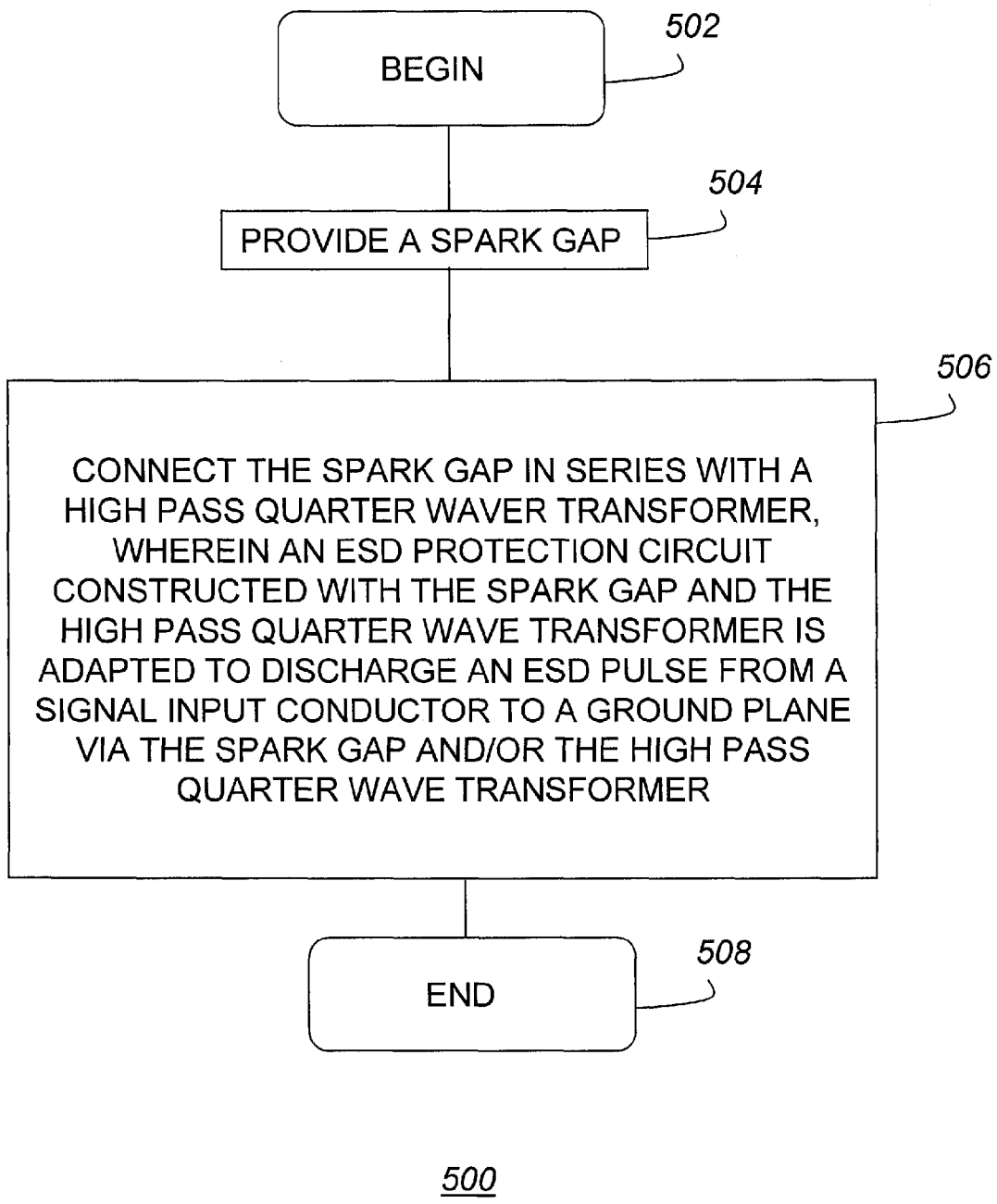
FIG. 5 is a process flow diagram of a method of constructing an ESD protection circuit in accordance with an exemplary embodiment of the present invention.

FIG. 5 is a process flow diagram of a method of constructing an ESD protection circuit such as the ESD protection circuit 200 (FIG. 2) in accordance with an exemplary embodiment of the present invention. The process is generally referred to by the reference number 500. At block 502, the process begins.

As described above, the ESD protection circuit resulting from the process 500 is adapted for use in an electronic device 100 (FIG. 1) having a signal input conductor 302 (FIG. 3). At block 504, a spark gap such as the spark gap 204 (FIG. 2) is provided. At block 506, the spark gap is connected in series with a high pass quarter wave transformer such as the high pass quarter wave transformer 208 (FIG. 2). The resulting ESD protection circuit is adapted to discharge an ESD pulse from the signal input conductor 302 (FIG. 3) to a ground plane 304 (FIG. 3) via the spark gap 204 (FIG. 2) and/or the high pass quarter wave transformer 208 (FIG. 2). At block 508, the process ends.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An electronic device (100), comprising:
    an electronic component (106) having a signal input conductor (302); and
    an electrostatic discharge (ESD) protection circuit (200) that includes a spark gap (204) in series with a high pass quarter wave transformer (208), the ESD protection circuit (200) being adapted to discharge an ESD pulse from the signal input conductor (302) to a ground plane (304) via the spark gap (204) and/or the high pass quarter wave transformer (208), the spark gap (204) including at least one spark gap pad (306) that is adapted to allow a spark to discharge the ESD pulse from the signal input conductor (302) to the ground plane (304) when the ESD pulse reaches a voltage threshold, the at least one spark gap pad (306) comprising a generally triangular portion of the ground plane (304), and wherein a vertex of the at least one spark gap pad (306) is oriented to point in the general direction of the signal input conductor (302).

2. The electronic device (100) recited in claim 1, comprising a low capacitance ESD element (206) connected in parallel with the spark gap (204) and the high pass quarter wave transformer (208).

3. The electronic device (100) recited in claim 1, wherein a path between the at least one spark gap pad (306) and the signal input conductor (302) is free from solder mask.

4. The electronic device (100) recited in claim 1, wherein the at least one spark gap pad (306) is positioned at a substantially high point of current density with respect to the signal input conductor (302).

5. The electronic device (100) recited in claim 1, wherein the at least one spark gap pad (306) comprises a first spark gap pad and a second spark gap pad (306), the second spark gap pad acting as a back-up to the first spark gap pad (306).

6. The electronic device (100) recited in claim 1, wherein the high pass quarter wave transformer (208) comprises a capacitive element (402), a first inductive element (404) connected in parallel with the capacitive element (402) via a first terminal of the capacitive element (402), and a second inductive element (406) connected in parallel with the capacitive element (402) via a second terminal of the capacitive element (402).

7. The electronic device (100) recited in claim 1, wherein the electronic device (100) comprises an automotive radio.

8. A method (500) of constructing an electrostatic discharge (ESD) protection circuit (200), the ESD protection circuit (200) being adapted for use in an electronic component (106) having a signal input conductor (302), the method comprising:
    providing (504) a spark gap (204);
    connecting (506) the spark gap (204) in series with a high pass quarter wave transformer (208), wherein the ESD protection circuit (200) is adapted to discharge an ESD pulse from the signal input conductor (302) of the electronic component (106) to a ground plane (304) via the spark gap (204) and/or the high pass quarter wave transformer (208), the spark gap (204) including at least one spark gap pad (306) that is adapted to allow a spark to discharge the ESD pulse from the signal input conductor (302) to the ground plane (304) when the ESD pulse reaches a voltage threshold, the at least one spark gap pad (306) comprising a generally triangular portion of the ground plane (304), and wherein a vertex of the at least one spark gap pad (306) is oriented to point in the general direction of the signal input conductor (302).

9. The method of claim 1, The electronic device (100) recited in claim 1, wherein the vertex of the at least one spark gap pad (306) is oriented to point in a direction perpendicular to a linear edge of the signal input conductor (302).

10. The method (500) recited in claim 8, comprising connecting a low capacitance ESD element (206) in parallel with the spark gap (204) and the high pass quarter wave transformer (208).

11. The method (500) recited in claim 8, wherein a path between the at least one spark gap pad (306) and the signal input conductor (302) is free from solder mask.

12. The method (500) recited in claim 8, wherein the at least one spark gap pad (306) is positioned at a substantially high point of current density with respect to the signal input conductor (302).

13. The method (500) recited in claim 8, wherein the at least one spark gap pad (306) comprises a first spark gap pad and a second spark gap pad (306), the second spark gap pad acting as a back-up to the first spark gap pad (306).

14. The method (500) recited in claim 8, wherein the high pass quarter wave transformer (208) comprises a capacitive element (402), a first inductive element (404) connected in parallel with the capacitive element (402) via a first terminal of the capacitive element (402), and a second inductive element (406) connected in parallel with the capacitive element (402) via a second terminal of the capacitive element (402).

15. The method (500) recited in claim 8, wherein the high pass quarter wave transformer (208) comprises a single stage transformer.

\* \* \* \* \*